US009983225B2

(12) United States Patent
Fertig et al.

(10) Patent No.: US 9,983,225 B2
(45) Date of Patent: May 29, 2018

(54) OPTICAL-MECHANICAL VIBRATING BEAM ACCELEROMETER

(71) Applicant: Honeywell International Inc., Morris Plains, NJ (US)

(72) Inventors: Chad Fertig, Bloomington, MN (US); Arthur Savchenko, Kirkland, WA (US); Steven Tin, Plymouth, MN (US)

(73) Assignee: Honeywell International Inc., Morris Plains, NJ (US)

( * ) Notice: Subject to any disclaimer, the term of this patent is extended or adjusted under 35 U.S.C. 154(b) by 323 days.

(21) Appl. No.: 14/996,116

(22) Filed: Jan. 14, 2016

(65) Prior Publication Data
US 2016/0377647 A1    Dec. 29, 2016

Related U.S. Application Data

(60) Provisional application No. 62/186,233, filed on Jun. 29, 2015.

(51) Int. Cl.
    *G01P 15/093*    (2006.01)
    *G01P 15/097*    (2006.01)
    (Continued)

(52) U.S. Cl.
    CPC .......... *G01P 15/093* (2013.01); *G01P 15/097* (2013.01); *G01P 21/00* (2013.01);
    (Continued)

(58) Field of Classification Search
    None
    See application file for complete search history.

(56) References Cited

U.S. PATENT DOCUMENTS

| 3,275,835 A | 9/1966 | Morrison |
| 4,429,573 A | 2/1984 | Walker |

(Continued)

FOREIGN PATENT DOCUMENTS

| CN | 101458152 B | 12/2010 |
| EP | 2128565 A1 | 12/2009 |

(Continued)

OTHER PUBLICATIONS

Intention to Grant from counterpart European Application No. 16174468.5, dated Mar. 17, 2017, 34 pp.
Extended Search Report from counterpart European Application No. 16174468.5, dated Aug. 4, 2016, 6 pp.
Davanco et al., "Slot-mode-coupled optomechanical crystals," OSA, Optics Express, vol. 20, No. 22, Oct. 22, 2012, 17 pp.
(Continued)

*Primary Examiner* — Robert R Raevis
(74) *Attorney, Agent, or Firm* — Shumaker & Sieffert, P.A.

(57) ABSTRACT

Systems, devices, techniques, and methods are disclosed for an opto-mechanical vibrating beam accelerometer. In one example, a system is configured to couple a laser into optical resonance with opto-mechanically active (OMA) anchors suspending a proof mass; lock frequencies of the laser to optical resonances of the OMA anchors, resulting in a modulated laser coupled with the OMA anchors; demodulate a photocurrent that detects the modulated laser coupled with the OMA anchors to detect at least an amplitude or a phase of the modulated laser; lock a frequency of the modulated laser to dynamically track instantaneous resonance frequencies of mechanical modes of the OMA anchors through changes to the amplitude or phase of the modulated laser induced by coupling of the modulated laser to the OMA anchors; and measure an acceleration based on instantaneous resonance frequencies of the OMA anchors through changes to the amplitude or phase of the modulated laser.

20 Claims, 8 Drawing Sheets

(51) Int. Cl.
    *G01P 21/00*      (2006.01)
    *H01S 5/00*      (2006.01)
    *H01S 5/0687*      (2006.01)

(52) U.S. Cl.
    CPC .......... *H01S 5/0014* (2013.01); *H01S 5/0085* (2013.01); *H01S 5/0687* (2013.01)

(56) References Cited

U.S. PATENT DOCUMENTS

| | | |
|---|---|---|
| 5,559,358 A | 9/1996 | Burns et al. |
| 5,969,249 A | 10/1999 | Roessig et al. |
| 6,350,983 B1 | 2/2002 | Kaldor et al. |
| 6,668,111 B2 | 12/2003 | Tapalian et al. |
| 6,776,042 B2 | 8/2004 | Pike et al. |
| 6,978,673 B2 | 12/2005 | Johnson et al. |
| 7,444,868 B2 | 11/2008 | Johnson |
| 7,605,391 B2 | 10/2009 | Burns |
| 7,881,565 B2 | 2/2011 | Kilic et al. |
| 7,980,115 B2 | 7/2011 | Stewart et al. |
| 8,205,497 B1 | 6/2012 | Okandan et al. |
| 8,334,984 B2 | 12/2012 | Perez et al. |
| 8,616,055 B2 | 12/2013 | Geen |
| 8,640,542 B2 | 2/2014 | Zhang et al. |
| 8,726,732 B2 | 5/2014 | Littler et al. |
| 8,783,106 B1 | 7/2014 | Nielson et al. |
| 8,849,075 B2 | 9/2014 | Painter et al. |
| 8,860,933 B2 | 10/2014 | Compton et al. |
| 8,873,029 B2 | 10/2014 | Wilfinger et al. |
| 8,904,867 B2 | 12/2014 | Martin et al. |
| 9,030,655 B2 | 5/2015 | Strabley |
| 9,069,004 B2 | 6/2015 | Bhave et al. |
| 2010/0063763 A1 | 3/2010 | Rozelle |
| 2012/0103099 A1 | 5/2012 | Stuke et al. |
| 2012/0265481 A1 | 10/2012 | Stewart et al. |
| 2014/0016118 A1 | 1/2014 | Compton et al. |
| 2014/0022534 A1 | 1/2014 | Strabley et al. |
| 2014/0043614 A1* | 2/2014 | Dhayalan ............ G02B 6/42 356/445 |
| 2014/0096587 A1 | 4/2014 | Stewart et al. |
| 2014/0208823 A1 | 7/2014 | Trusov et al. |
| 2014/0230520 A1 | 8/2014 | Bulatowicz |
| 2015/0020590 A1 | 1/2015 | Painter et al. |

FOREIGN PATENT DOCUMENTS

| | | |
|---|---|---|
| EP | 2717060 A1 | 4/2014 |
| EP | 2770331 A1 | 8/2014 |
| WO | 2004012201 A2 | 2/2004 |
| WO | 2005069016 A1 | 7/2005 |
| WO | 2006096741 A1 | 9/2006 |
| WO | 2007098788 A1 | 9/2007 |
| WO | 2013131067 A1 | 9/2013 |
| WO | 2015059511 A1 | 4/2015 |

OTHER PUBLICATIONS

Krause et al., "A microchip optomechanical accelerometer," Nature Photonics, vol. 6, No. 11, Mar. 26, 2012, Retrieved from http://arxiv.org/abs/1203.5730, 16 pp.

Alegre et al., "Optomechanical Zipper Cavity Lasers: Theoretical Analysis of Tuning Range and Stability," OSA, Optics Express, vol. 18, No. 8, Apr. 12, 2010, 14 pp.

Cohen et al., "Phonon Counting and Intensity Interferometry of a Nanomechanical Resonator," Macmillan Publishers Limited, Nature vol. 520, Apr. 23, 2015, 4 pp.

Cohen et al., "Optical Coupling to Nanoscale Optomechanical Cavities for Near Quantum-Limited Motion Transduction," OSA, Optics Express, vol. 21, No. 9 May 1, 2013, 10 pp.

Pitanti et al., "Strong Opto-Electro-Mechanical Coupling in a Silicon Photonic Crystal Cavity," OSA, Optics Express, vol. 23, No. 3, Feb. 3, 2015, 13 pp.

Woolf et al., "Optomechanical and Photothermal Interactions in Suspended Photonic Crystal Membranes," OSA, Optics Express, vol. 21, No. 6, Mar. 25, 2013, 18 pp.

Yu et al., "A Vibration-Based MEMS Piezoelectric Energy Harvester and Power Conditioning Circuit," Sensors, vol. 14, No. 2, Jan. 21, 2014, 19 pp.

Kim et al., "Real-Time Tuning of MEMS Gyro Dynamics," 2005 American Control Conference, FrA06.5, Jun. 8-10, 2005, 6 pp.

Trusov et al., "Silicon Accelerometer with Differential Frequency Modulation and Continuous Self-Calibration," 26th International Conference on Micro Electro Mechanical Systems (MEMS), Jan. 20-24, 2013, 4 pp.

Chan et al., "Optical and mechanical design of a 'zipper' photonic crystal optomechanical cavity," Optical Society of America, Optics Express, vol. 17, No. 5, Mar. 2, 2009, pp. 3802-3817.

Davies et al., "Remote Photothermal Actuation for Calibration of In-Phase and Quadrature Readout in a Mechanically Amplified Fabry-Perot Accelerometer," IEEE Photonics Journal, vol. 6, No. 3, Jun. 6, 2014, 16 pp.

Zabit et al., "A self-mixing displacement sensor compensating parasitic vibration with a MEMs accelerometer," 2011 IEEE Sensors, Oct. 28-31, 2011, 4 pp.

Datta et al., "Stress and magnetic field-dependent Young's modulus in single crystal iron-gallium alloys," Journal of Magnetism and Magnetic Materials, vol. 322, Feb. 4, 2010, pp. 2135-2144.

Eichenfield et al., "A picogram- and nanometre-scale photonic-crystal optomechanical cavity," Nature, vol. 459, Letters, May 2009, pp. 550-556.

Siegel et al., "The Variation of Young's Modulus with Magnetization and Temperature in Nickel," Physical Review, vol. 49, May 1, 1936, 9 pp.

U.S. Appl. No. 14/951,132, by Honeywell International Inc. (Inventors: Steven Tin et al.), filed Nov. 24, 2015.

U.S. Appl. No. 14/847,880, by Honeywell International Inc. (Inventors: Chad Fertig et al.), filed Sep. 8, 2015.

\* cited by examiner

OPTICAL-MECHANICAL VIBRATING BEAM ACCELEROMETER

This application claims the benefit of U.S. Provisional Application No. 62/186,233, filed Jun. 29, 2015, and entitled "OPTICAL-MECHANICAL VIBRATING BEAM ACCELEROMETER," the entire content of which is incorporated herein by reference.

TECHNICAL FIELD

This disclosure relates to accelerometers.

BACKGROUND

Inertial guidance systems may use navigation grade accelerometers, such as Resonating Beam Accelerometers (RBAs). An RBA may sense acceleration via stress-induced frequency shifts of vibrational modes of proof mass anchor beams. The beams may be arranged in a Double Ended Tuning Fork (DETF) topology.

SUMMARY

Various examples provided herein are generally directed to techniques, systems, devices, computer program products, and methods for an opto-mechanical vibrating beam accelerometer for high-performance inertial guidance systems on platforms subject to a very wide range of accelerations, such as tens of thousands of gees. An opto-mechanical vibrating beam accelerometer of this disclosure may also provide very high bandwidth, very high dynamic range, and very high sensitivity for accurately detecting accelerations relevant to the platform and mission across a very wide range of accelerations, and with low size, weight, and power (SWAP). An opto-mechanical vibrating beam accelerometer of this disclosure may also periodically or continuously recalibrate for scale factor and bias to ensure accurate navigation, including on long-range missions. An opto-mechanical vibrating beam accelerometer of this disclosure may thereby in some examples, for the first time, enable continuous, accurate active navigation for gun-launched munitions, including aircraft-mounted gun-launched munitions, among other applications.

In one example, a system is configured to couple one or more lasers into optical resonance with one or more opto-mechanically active (OMA) anchors suspending a proof mass in an accelerometer. The system is further configured to lock frequencies of the one or more lasers to one or more optical resonances of the one or more opto-mechanically active anchors, resulting in a modulated laser coupled with the one or more opto-mechanically active anchors. The system is further configured to demodulate a photocurrent generated by a photodiode that detects the modulated laser coupled with the one or more opto-mechanically active anchors to detect at least one of an amplitude or a phase of the modulated laser. The system is further configured to lock a frequency of the modulated laser to dynamically track instantaneous resonance frequencies of one or more mechanical modes of the one or more opto-mechanically active anchors through changes to at least one of the amplitude or the phase of the modulated laser induced by the coupling of the modulated laser to the mechanical modes of the one or more opto-mechanically active anchors. The system is further configured to measure an acceleration of the accelerometer based at least in part on the instantaneous resonance frequencies of the one or more mechanical modes of the one or more opto-mechanically active anchors, as dynamically tracked through the changes to the at least one of the amplitude or the phase of the modulated laser.

In another example, a method includes coupling one or more lasers into optical resonance with one or more opto-mechanically active (OMA) anchors suspending a proof mass in an accelerometer. The method further includes locking frequencies of the one or more lasers to one or more optical resonances of the one or more opto-mechanically active anchors, resulting in a modulated laser coupled with the one or more opto-mechanically active anchors. The method further includes demodulating a photocurrent generated by a photodiode that detects the modulated laser coupled with the one or more opto-mechanically active anchors to detect at least one of an amplitude or a phase of the modulated laser. The method further includes locking a frequency of the modulated laser to dynamically track instantaneous resonance frequencies of one or more mechanical modes of the one or more opto-mechanically active anchors through changes to at least one of the amplitude or the phase of the modulated laser induced by the coupling of the modulated laser to the mechanical modes of the one or more opto-mechanically active anchors. The method further includes measuring an acceleration of the accelerometer based at least in part on the instantaneous resonance frequencies of the one or more mechanical modes of the one or more opto-mechanically active anchors, as dynamically tracked through the changes to the at least one of the amplitude or the phase of the modulated laser.

In another example, a device includes means for coupling one or more lasers into optical resonance with one or more opto-mechanically active (OMA) anchors suspending a proof mass in an accelerometer. The device further includes means for locking frequencies of the one or more lasers to one or more optical resonances of the one or more opto-mechanically active anchors, resulting in a modulated laser coupled with the one or more opto-mechanically active anchors. The device further includes means for demodulating a photocurrent generated by a photodiode that detects the modulated laser coupled with the one or more opto-mechanically active anchors to detect at least one of an amplitude or a phase of the modulated laser. The device further includes means for locking a frequency of the modulated laser to dynamically track instantaneous resonance frequencies of one or more mechanical modes of the one or more opto-mechanically active anchors through changes to at least one of the amplitude or the phase of the modulated laser induced by the coupling of the modulated laser to the mechanical modes of the one or more opto-mechanically active anchors. The device further includes means for measuring an acceleration of the accelerometer based at least in part on the instantaneous resonance frequencies of the one or more mechanical modes of the one or more opto-mechanically active anchors, as dynamically tracked through the changes to the at least one of the amplitude or the phase of the modulated laser.

The details of one or more examples are set forth in the accompanying drawings and the description below. Other features, objects, and advantages will be apparent from the description and drawings, and from the claims.

DETAILED DESCRIPTION

Some state-of-the-art MEMS accelerometers can be low size, weight, and power (SWAP), some can have low bias and scale-factor drift, some can read-out at high input accelerations, and some have the potential for high bandwidth due to their small size. However, state-of-the-art MEMS accelerometers have a dynamic range that is limited by their readout mechanisms. State-of-the-art MEMS accelerometers use electrical readout to sense acceleration. Examples of electrical readout are capacitive sensors or piezoelectric sensors, which transduce acceleration to electrical voltages. Electrical noise in the preamplification electronics for sensing the transduced signals limits the signal to noise ratio (SNR), and limits the dynamic range (DNR) on the low acceleration end of the transduced signals' DNR. Biases stemming from large bending nonlinearity limits the transduced signals' accuracy on the high acceleration end of their DNR. An OMVB accelerometer of this disclosure may instead use a coupled optical-mechanical readout method that is not subject to the limiting factors of DNR inherent in capacitive or piezoelectric transducer readout methods.

Capacitively read-out MEMS accelerometers are subject to drift in scale factor (SF) and bias due to charge buildup on insulating surfaces, and the subsequent random migration of those charges around the inside of the accelerometer package. Capacitively read-out MEMS accelerometers are also limited by parasitic capacitive coupling between drive and sense electrodes and their connecting traces. Capacitively read-out MEMS accelerometers are also limited by contact voltage effects due to changing work functions on the capacitive electrodes when their surfaces adsorb gas molecules. Capacitively read-out MEMS accelerometers are also limited by spring softening of their tethers. A coupled optical-mechanical readout method of an opto-mechanical vibrating beam accelerometer of this disclosure is not subject to these sources of drift in scale factor and bias.

Capacitively read-out MEMS accelerometers have a trade-off of size with sensitivity. In capacitively read-out MEMS accelerometers, the size of the transduced voltage scales with the area of the capacitors, which demands larger structures for larger signals and better sensitivity, for a fixed pre-amplifier noise. Thus, it may be difficult to simultaneously scale capacitively read-out MEMS accelerometers to a high acceleration range while maintaining high bandwidth and high sensitivity. A small size is advantageous for minimizing thermal gradients that are a source of long term instability of bias and scale factor. Thus, capacitively read-out MEMS accelerometers face an inherent trade-off between sensitivity and drift in bias and scale factor. The coupled optical-mechanical readout method of an opto-mechanical vibrating beam accelerometer of this disclosure escapes this inherent trade-off between sensitivity and drift in bias and scale factor of capacitively read-out accelerometers. An opto-mechanical vibrating beam accelerometer of this disclosure thus enables the use of very light proof masses and very stiff anchors, to allow for high acceleration and high bandwidth operation with a high DNR and high sensitivity.

Large proof mass, force-rebalance MEMS accelerometers have good scale factor and bias stability by limiting the bending of anchor beams, by the active balancing of inertial forces on the proof mass with applied electrostatic forces. However, this approach is not scalable to high accelerations and high bandwidth simultaneously; the high voltages required to apply large forces to large proof masses may typically exceed the dielectric breakdown voltages of small gaps in the system, and parasitic resistances in the electrical traces impose electrical response time constraints that are incompatible with high bandwidth actuation. An opto-mechanical vibrating beam accelerometer of this disclosure may operate in an open loop Vibrating Beam Accelerometer (VBA) geometry that may provide high sensitivity, high bandwidth and high dynamic range, even at very high accelerations such as tens of thousands of gees (multiples of the standard Earth surface gravitational acceleration g), such as approximately 50,000 gees in some examples.

Bias and scale factor in MEMS accelerometers can change over time, and according to the environments in which they are used. Currently, these changes can only be measured if the device is placed into a controlled setting, such as a factory calibration station. Methods have been investigated to detect changes to bias and scale factor during operation, without external hardware or communications with external information (such as GPS, or radio transmissions from a stable platform), but they require the use of very light proof masses, which is incompatible with capacitive sensing, given the trade space restrictions pointed out above. An opto-mechanical vibrating beam accelerometer of this disclosure may be completely compatible with repeated in-situ calibration, and even calibration simultaneous with operation, as further described below. An opto-mechanical vibrating beam accelerometer of this disclosure may periodically or continuously perform in-situ recalibration of bias and scale factor to maintain accuracy over time.

MEMS accelerometers may typically have vibrational nonlinearities. In MEMS accelerometers with low operating bandwidth, the proof mass mode resonance is typically in a frequency range easily excited by shock or acoustic perturbations. These vibrations may cause a vibration rectification bias if they occur at frequencies higher than the sampling frequency of the accelerometer, but within the mechanical bandwidth of the proof mass mode. Moreover, state of the art MEMS accelerometers typically use gas to damp the proof mass mode, to limit the amplitude of vibrations at the resonance frequency. However, gas adsorption can cause bias instability, as described above. An opto-mechanical vibrating beam accelerometer of this disclosure may operate with a mechanical resonance beyond the acoustical regime, and in a vacuum package, thereby greatly mitigating vibration rectification bias and gas adsorption effects.

Figure 1:
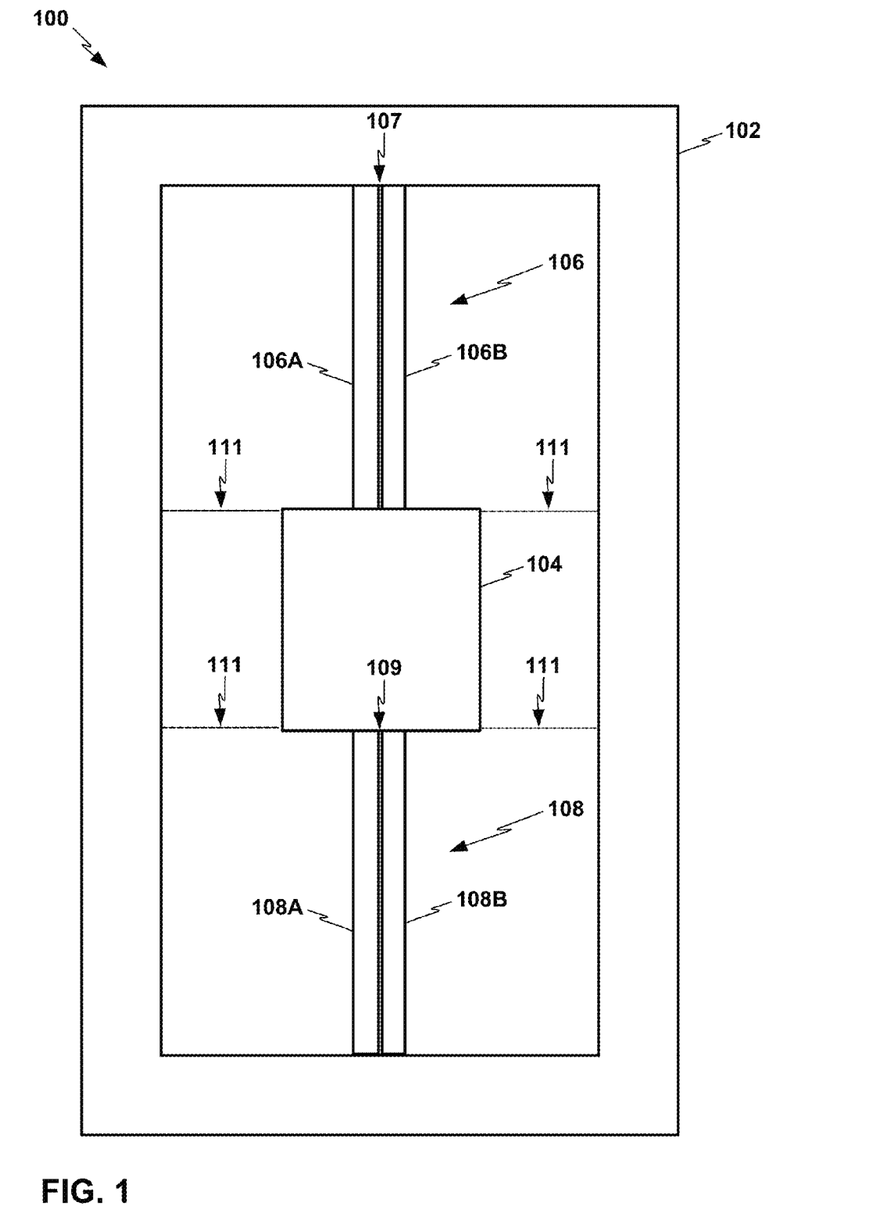
FIG. 1 depicts a conceptual diagram of an optical-mechanical vibrating beam accelerometer ("OMVB accelerometer") of this disclosure comprising a frame and a proof mass suspended from the frame by two opto-mechanically active anchors ("OMA anchors") in a double-ended tuning fork (DETF) topology, in one aspect of this disclosure.

FIG. 1 depicts a conceptual diagram of an optical-mechanical vibrating beam accelerometer ("OMVB accelerometer") 100 of this disclosure comprising a frame 102 and a proof mass 104 suspended from frame 102 by two opto-mechanically active anchors 106, 108 ("OMA anchors 106, 108") in a double-ended tuning fork (DETF) vibrating beam topology, in one aspect of this disclosure. One example of such an opto-mechanically active anchor beam is the zipper cavity photonic structures depicted at 106, 108. OMA anchor 106 includes a pair of photonic crystal mechanical beams 106A, 106B separated by a gap 107, constituting a "zipper opto-mechanical cavity", which permits opto-mechanical coupling between mechanical beams 106A, 106B, by a laser field interacting with the beams 106A, 106B and gap 107. Similarly, OMA anchor 108 includes a pair of photonic crystal mechanical beams 108A, 108B separated by a gap 109 which permits opto-mechanical coupling between mechanical beams 108A, 108B by a laser field interacting with the beams 108A, 108B, and gap 109, also constituting a "zipper opto-mechanical cavity". The laser field interacting with the first OMA anchor 106 and the laser field interacting with the second OMA anchor 108 may be derived from the same laser source or from different laser sources. Accelerometer 100 may include other components not shown in FIG. 1, examples of which are further described below. Accelerometer 100 is further described below in an example implementation, with the understanding that analogous descriptions may apply to any of a variety of other implementation details.

OMA anchors 106, 108 thus composed and arranged may interact with the laser fields in such a way that the laser fields drive mechanical vibrations of OMA anchors 106, 108; detect the presence of mechanical vibrations of OMA anchors 106, 108; and determine the frequencies of mechanical vibrational resonances of the OMA anchors 106, 108. OMA anchors 106, 108 may further interact with laser fields that drive, detect, and determine the frequency of vibrational resonances of the OMA anchors 106, 108 as they change with acceleration, as further explained below. OMA anchors 106, 108 may thereby enable optical readout of inertial forces on proof mass 104 with one or more lasers. Accelerometer 100 thus enables optical readout of the vibrational frequencies of photonic crystal mechanical beams 106A, 106B, 108A, 108B of OMA anchors 106, 108 of accelerometer 100.

Accelerometer 100 may sense acceleration by measuring the shift in the mechanical resonance frequency of OMA anchors 106, 108 as they are strained by proof mass 104 in response to inertial forces. The vibrating beam topology of accelerometer 100 has good bias stability and does not require force rebalancing to operate over its dynamic range. Accelerometer 100 thus may use a very light proof mass 104 and very stiff anchoring via OMA anchors 106, 108, enabling accurate operation under high acceleration with high bandwidth and high dynamic range. Because accelerometer 100 uses optical readout, it is not subject to the sources of scale factor and bias drift of capacitive readout accelerometers. Accelerometer 100 may incorporate in-situ calibration for bias and scale factor, and may allow for very high frequency mechanical modes and for operation in a vacuum package, thus mitigating the effects of shock, acoustic perturbations, and gas adsorption.

Accelerometer 100 includes a light proof mass 104 suspended between stiff anchor beams OMA anchors 106, 108, which provide a strong coupling between an internal optical mode and one or more internal mechanical vibrational modes. The zipper opto-mechanical cavities composed of photonic crystal beams 106A, 106B, separated by gap 107, and 108A, 108B, separated by gap 109, are example implementations of OMA anchors (optical-mechanically active anchors) that provide a coupling between an internal optical mode and one or more internal mechanical vibrational modes. In other examples, an accelerometer of this disclosure may include any of various other types of optical-mechanically active anchor structures that couple one or more internal optical modes with one or more internal mechanical vibration modes, analogous to, but not necessarily identical to the laser zipper opto-mechanical cavities composed of photonic crystal beams 106A, 106B, separated by gap 107, and photonic crystal beams 108A, 108B, separated by gap 109 as in the example of FIG. 1. Proof mass 104 may also, in some examples, be attached to frame 102 by tethers 111 that restrict the motion of proof mass 104 to only the sensitive direction, along the axis connecting the OMA anchors 106, 108.

Figure 2:
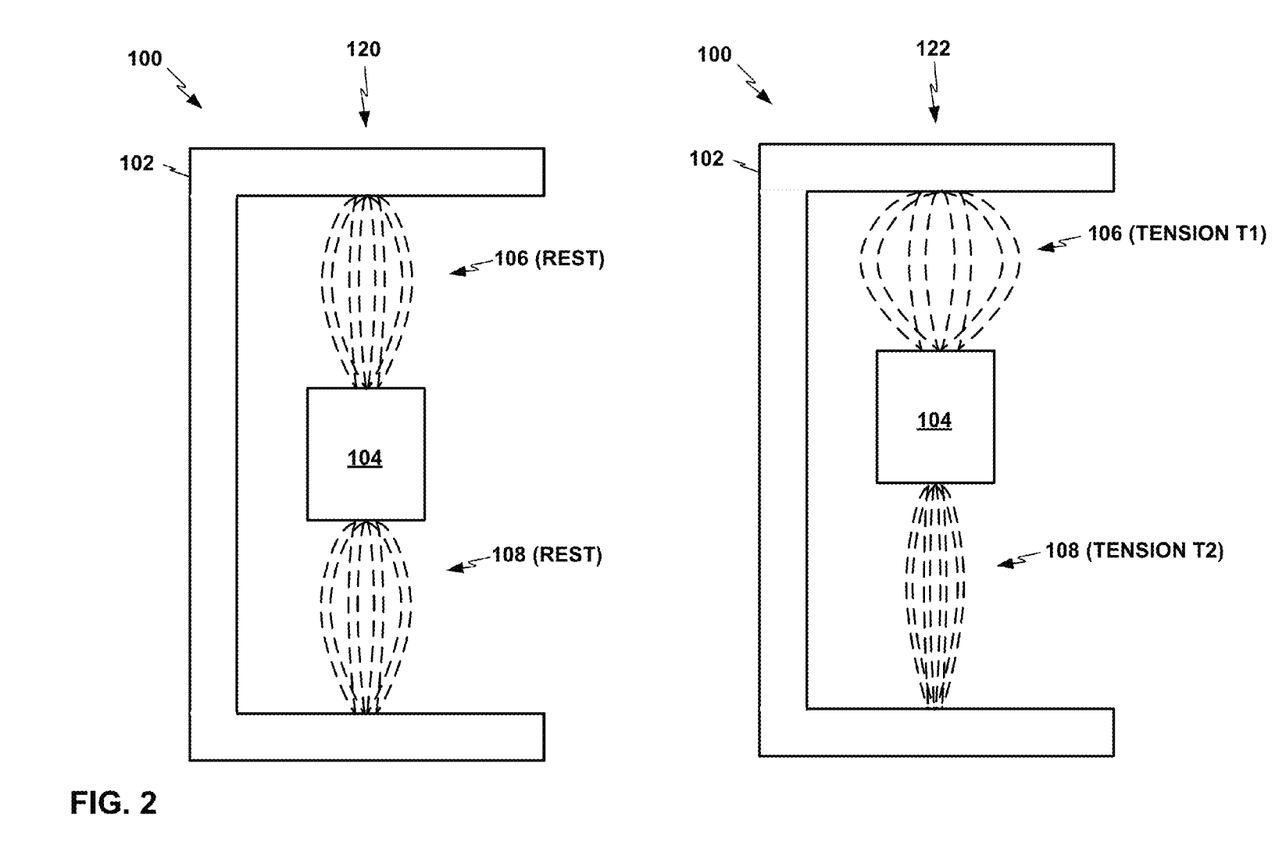
FIG. 2 shows a conceptual diagram of an opto-mechanical vibrating beam accelerometer at rest and under acceleration, in some aspects of this disclosure.

FIG. 2 shows a conceptual diagram of vibrating beam accelerometer 100 at rest (120) and under acceleration in the downward direction (122), in some aspects of this disclosure. With the VBA topology of accelerometer 100, when proof mass 104 is subject to inertial forces, strains in the anchor beams OMA anchors 106, 108, change the mechanical resonance frequencies of the internal vibrational modes of OMA anchors 106, 108. In various implementations, both OMA anchors 106 and 108 are in tension even at zero acceleration. When accelerometer 100 is accelerated in the downward direction in the orientation of FIG. 1, proof mass 104 is accelerated in the opposite, upward direction relative to the reference frame of frame 102 with acceleration a as shown in FIG. 2, thereby exerting a relative compressive strain on OMA anchor 106, such that OMA anchor 106 is at a tension T1 less than its tension at rest; and exerting relative tensile strain on OMA anchor 108, such that OMA anchor 108 is at a tension T2 greater than its tension at rest (as indicated at 122), and causing opposite shifts in the resonant mechanical vibrational frequency of each of OMA anchors 106, 108. Accelerometer 100 may thus perform a differential measurement of the two shifts as a measure of acceleration that may cancel out certain sources of bias and noise, thereby promoting an accurate measurement of acceleration. In accelerometer 100, the resonance frequencies of each of OMA anchors 106, 108 are read out with a laser in a method that may be referred to as Stimulated Raman Opto-mechanical Spectroscopy ("SROM Spectroscopy" or "SROMS"), as further described below.

Figure 3:
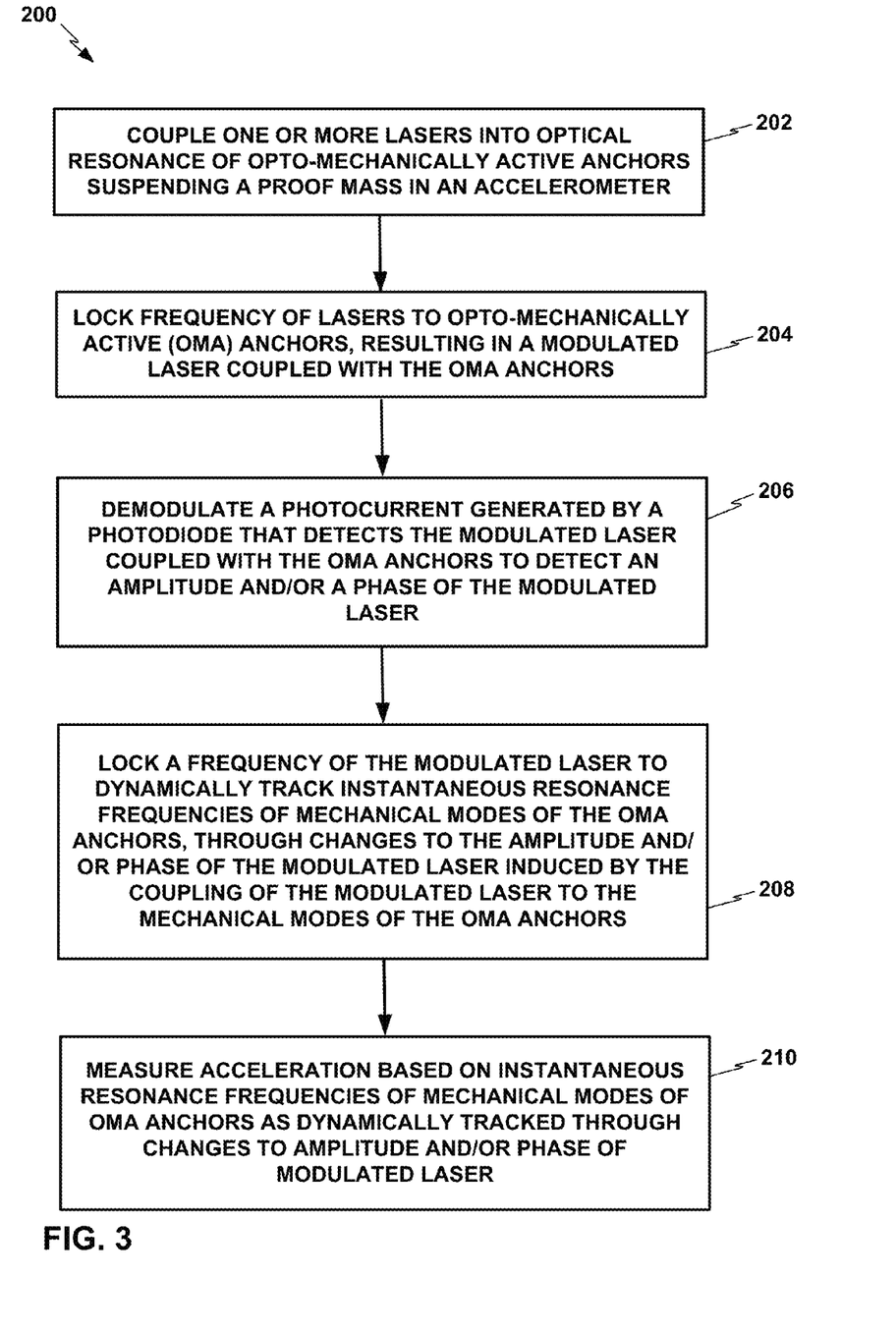
FIG. 3 depicts a flowchart for an example Stimulated Raman Opto-Mechanical Spectroscopy ("SROM Spectroscopy") method that may be performed with an opto-mechanical accelerometer in some aspects of this disclosure.

FIG. 3 depicts a flowchart for an example Stimulated Raman Opto-mechanical Spectroscopy (SROM Spectroscopy) method 200 that may be performed with accelerometer 100, in various aspects of this disclosure. SROM Spectroscopy method 200 may include coupling one or more lasers into optical resonance with one or more opto-mechanically active (OMA) anchors suspending a proof mass in an accelerometer (e.g., coupling lasers into optical resonance with vibrating anchor beams in OMA anchors 106, 108 suspending proof mass 104 from frame 102 in accelerometer 100 as shown in FIG. 1) (202). SROM Spectroscopy method 200 may further include locking the frequencies of the one or more lasers to one or more optical resonances of the one or more OMA anchors, resulting in a modulated laser coupled with the one or more OMA anchors (e.g., of the optical resonances of OMA anchors 106, 108) (204). SROM Spectroscopy method 200 may further include demodulating a photocurrent generated by a photodiode that detects the modulated laser coupled with the one or more OMA anchors to detect at least one of an amplitude or a phase of the modulated laser (206). SROM Spectroscopy method 200 may further include locking a frequency of the modulated laser to dynamically track instantaneous resonance frequencies of one or more mechanical modes of the one or more OMA anchors, indicative of one or more stresses on the one or more OMA anchors, through changes to at least one of the amplitude or the phase of the modulated laser induced by the coupling of the modulated laser to the mechanical modes of the one or more OMA anchors (208). SROM Spectroscopy method 200 may further include measuring an acceleration of the accelerometer based at least in part on the instantaneous resonance frequencies of the one or more mechanical modes of the one or more OMA anchors, as dynamically tracked through the changes to the at least one of the amplitude or the phase of the modulated laser using modulated laser light (e.g., of OMA anchors 106, 108) via demodulating a beat note between carrier and sideband components of one or more lasers that have passed through the one or more opto-mechanical coupling structures (210). These and other aspects of SROM Spectroscopy method 200 are further described below.

First (202), laser light may be coupled into the optical resonance of OMA anchors 106, 108 suspending a proof mass in an accelerometer either by a tapered optical fiber, or by a waveguide on an photonic integrated circuit (PIC), by a process of evanescent cross-coupling. The laser light enters the optical mode of OMA anchors 106, 108; interacts with the mechanical and optical modes of OMA anchors 106, 108; and ultimately returns to the optical fiber or waveguide for subsequent analysis, thus providing detection read-out of properties of OMA anchors 106, 108, or other opto-mechanical structures in other examples.

Second (204), the laser may be frequency locked to the optical resonance of the OMA anchors 106, 108. The locking of the frequency may be accomplished using lock-in techniques, such as with a dither and feedback applied to the laser current, which may be from a diode laser. If the optical resonance frequencies of the two OMA anchors are too different, two laser sources may be used, one locked to the resonance of each of OMA anchors 106, 108. If the optical resonances of OMA anchors 106, 108 can be made exactly or substantially equal, e.g., by a method of tuning or by high-precision construction, one laser source may be used for both OMA anchors 106, 108, by splitting the laser field emitted from single source into two paths, each path interacting with one of the OMA anchors, or by sending the laser through each OMA anchor in series.

Third (206), the frequency of the mechanical resonances of OMA anchors 106, 108 may be detected and tracked in real-time. This may be accomplished by monitoring a multi-tone laser field that has interacted with the optical and mechanical resonances of the OMA anchors 106, 108. For example, accelerometer 100 may impose a sideband component on the laser field that is coupled to the optical mode of OMA anchors 106, 108, which may be generated by a tunable signal source such as a voltage-controlled oscillator (VCO) or a direct digital synthesizer (DDS), operated at a tunable frequency f_FM, and applied to the laser field via an electro-optic single-sideband modulator. The modulated laser field may excite a particular mechanical mode of the beams of OMA anchors 106, 108, having eigenfrequency f_vib. In cases where the tunable frequency f_FM is equal to, or very nearly equal to, the eigenfrequency f_vib (e.g., when the frequency of modulation of the laser is resonant with the vibrational frequency of a mechanical mode of the OMA anchor), the amplitude and/or phase of the transmitted laser field may be significantly modified due to photons being exchanged between the carrier and sideband via stimulated Raman scattering, or other resonant coherent optical scattering processes, mediated by the mechanical mode of the OMA anchor. The OMA anchors 106, 108 must have a strong opto-mechanical coupling or cooperativity factor for stimulated Raman scattering mediated by mechanical modes to happen efficiently. In this case, optical energy strongly interacts with vibrational energy in the OMA anchor structure, and the laser light exiting the OMA anchors 106, 108 may be significantly modified in both amplitude and phase by the optical-mechanical interaction.

Fourth (208), the laser light exiting the OMA anchors 106, 108 may be incident on respective photodiodes, and accelerometer 100 may detect the amplitude and frequency of electrical beat notes thereby produced by the interaction of the carrier component and the sideband component of the laser light incident on the photodiode, for example, by using radio frequency (RF) demodulation techniques. In other implementations, a portion of the original laser source may be split off and re-combined with the portion having interacted with the respective OMA anchors 106, 108, in order to enhance the size of the electrical beat note signal, in accordance with the standard practice of optical heterodyne detection. In some implementations, the split-off light may itself be frequency shifted by means of an electro-optic modulator. Accelerometer 100 may actively track the frequency of the mechanical resonances of OMA anchors 106, 108 by a lock-in technique, wherein the sideband modulation frequency f_FM is impressed with slow modulation to create a zero-crossing error signal for locking the frequency of the source generating the signal at the tunable frequency f_FM to the mechanical resonance frequency f_vib of the respective OMA anchors 106, 108 by using an electronic-feedback loop (e.g. a frequency locked loop, or "FLL").

Fifth (210), the FLL thus locks the laser modulation frequency to track the mechanical resonance frequency of the respective OMA anchors 106, 108, to enable the use of optical readout to measure and track the stress-dependent frequency shifts of the mechanical vibrational modes of the OMA anchors 106 108, to provide optical read-out of the accelerations experienced by the proof mass 104. In the symmetric, double-sided VBA configuration of accelerometer 100, a differencing subsystem of accelerometer 100 may determine a difference of the value of the radio frequency f_RF modulating the laser interacting with OMA anchors 106, from the radio frequency f_RF modulating the laser interacting with OMA anchors 108, to provide an accurate measure of the acceleration. The mechanical modes of the OMA anchors 106, 108 may or may not be identically the same frequency at zero input acceleration.

In one illustrative advantage of the devices, systems, and methods described herein including accelerometer 100 and SROM Spectroscopy method 200, the signal-to-noise ratio (SNR) of the mechanical spectroscopy measurements is not subject to degradation by laser phase noise, as any phase noise is common to both the carrier and the sideband. Moreover, in some examples, an accelerometer of this disclosure may use RF sources that are coherently synthesized from a common clock via phase locked loop (PLL) circuits. In these examples, the phase noise of the RF sources may be canceled out in the measurement. Since an accelerometer of this disclosure may perform all the small signal processing at RF frequencies, not at DC, example accelerometers of this disclosure may avoid 1/f electrical noise. In this way, the fundamental noise of the measurement may be dominated by the photon shot noise of the lasers, which can yield very high SNR even for dim laser beams. This may contribute substantially to using optical readout to measure acceleration in a VBA topology.

Though the examples described above are described in terms of using OMA anchors 106, 108, which are based zipper opto-mechanical cavities, any of a wide variety of other optical-mechanical coupling structures may be used in other examples. The zipper opto-mechanical cavities composed of photonic crystal beams 106A, 106B, 108A, and 108B, separated by gaps 107, 109, respectively as described above, may provide various advantages such as very high quality factor mechanical and optical resonances (Q exceeding $1*10^6$ in both cases), and very high cooperativity factors (approaching 1).

Figure 4:
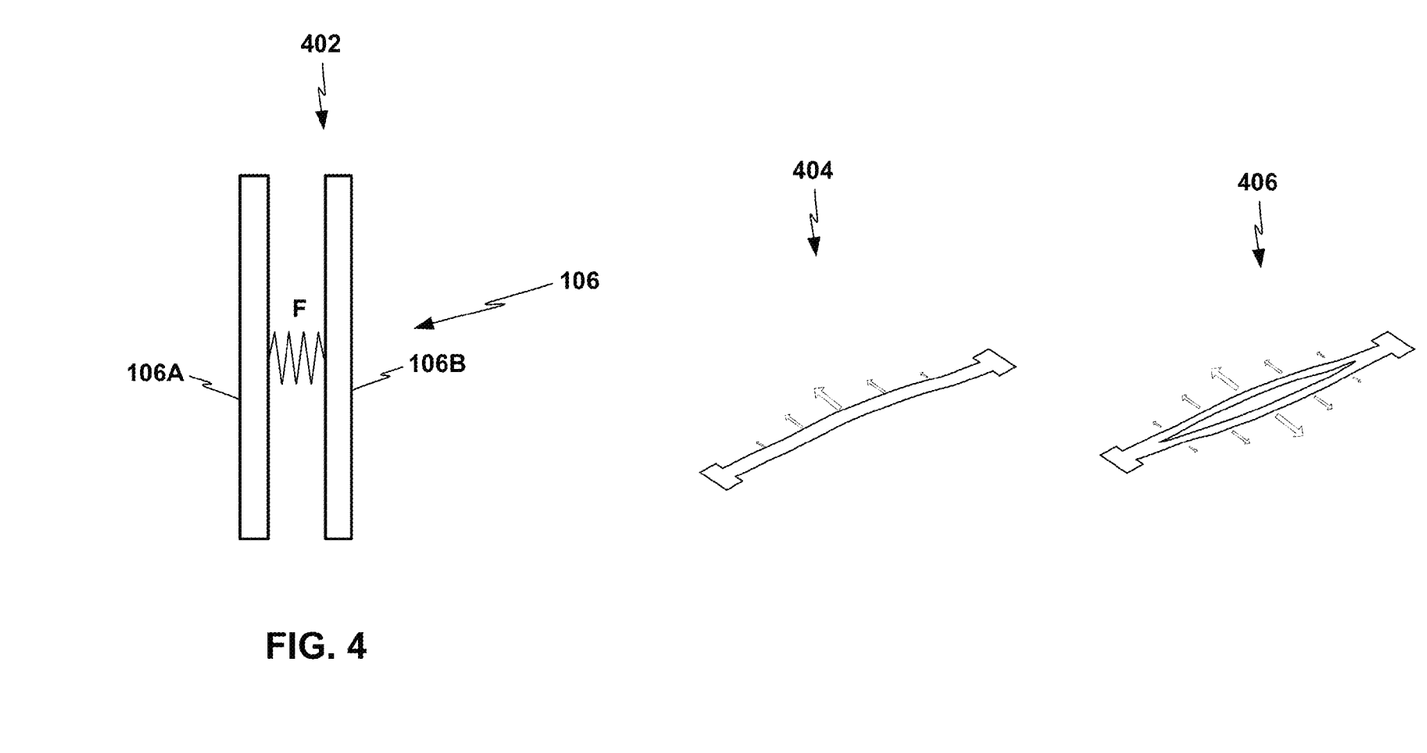
FIG. 4 depicts additional aspects of an opto-mechanical accelerometer in some aspects of this disclosure.

FIG. 4 depicts additional aspects of an accelerometer of this disclosure in some examples, including depictions of opto-mechanical coupling of OMA anchors 106, 108, a idealized depiction of a spring force provided by laser light between beams in an optical zipper in the gap between photonic crystal mechanical beams 106A, 106B of OMA anchor 106 (402); a perspective view depiction of vibration modes in beams in an optical zipper in one common direction together (404); and a perspective view depiction of vibration modes in beams in an optical zipper in opposing directions of oscillation (406).

Figure 5:
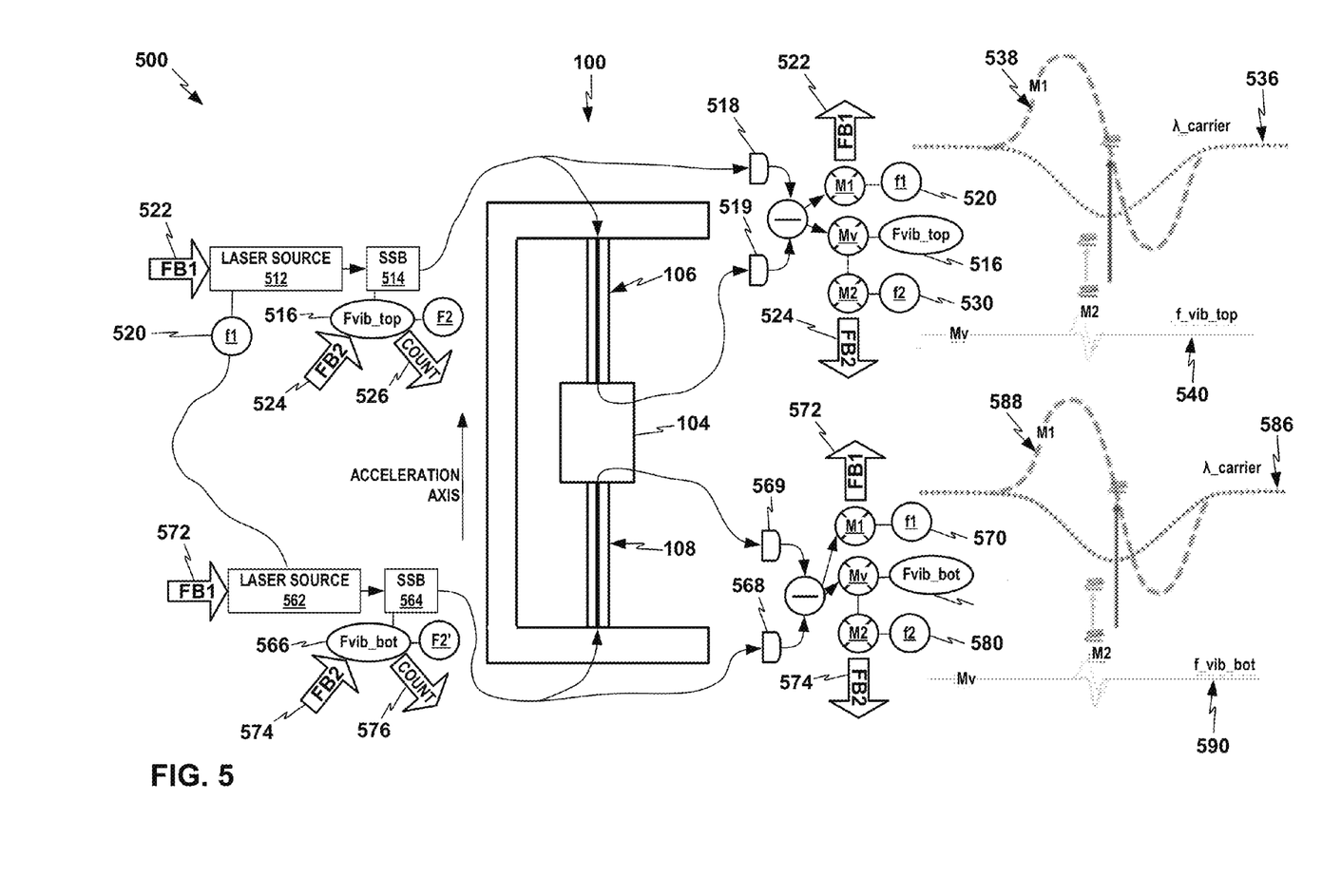
FIG. 5 depicts a conceptual diagram of an opto-mechanical accelerometer, in additional aspects of this disclosure.

FIG. 5 depicts a conceptual diagram of an accelerometer 500, analogous to accelerometer 100 described above but also shown with additional detail, in additional aspects of this disclosure. A frequency modulator 520 (F1) drives a first laser source 512 and a second laser source 562, which feed into single sideband modulators 514 and 564, respectively, which respectively add a sideband component to each of the lasers. After the lasers have passed through single sideband modulators 514, 564, each one is split apart such that one beam goes directly to a photodiode 518, 568, respectively, while the other laser beam is passed through respective OMA anchors 106, 108 to respective photodiodes 519, 569.

A differencer receives the signals from OMA anchor 106 from photodiodes 518, 519, and outputs direct carrier frequency optical response M1, depicted at right at 536, which is used to derive frequency modulator 520 (F1) and feedback 522 (FB1) fed back to first laser 512; and a differencer receives the signals from OMA anchor 108 from photodiodes 568, 569, and outputs direct carrier frequency optical response M1, depicted at right at 586, which is used for frequency modulator 520 (F1) and feedback 572 (FB1) fed back to second laser 562. Frequency modulator signals 520 and 570 (F1) are the reverse derivatives of carrier signals 536 and 586, and may be derived by demodulating the transmitted carrier component light through frequency modulation and dithering the signal to detect the zero of the derivative, indicative of the peak absorption of the carrier signal, and lock to the zero derivative as a means to lock onto the optical resonant frequencies of each of the OMA anchors 106, 108.

Frequency modulator 520 may modulate both lasers 512 and 562 such as by modulating driver current to diode lasers. The demodulated feedback signals 522 and 572 may be fed through PID servo loop circuits to individually modulate lasers 512 and 562 to lock lasers 512 and 562 to the optical resonances of the optical gaps or cavities of OMA anchors 106, 108.

The differencers may also generate vibrational mixer (Mv) signals that are used to derive sideband frequency modulator signals 516 ("Fvib_top"), 566 ("Fvib_bottom"), depicted at 540, 590, respectively. As opposed to the optical resonant frequencies of OMA anchors 106, 108 locked to the optical resonance by the absorption of the total laser power, sideband frequency modulator signals 516, 518 may be tuned to match the mechanical vibration resonance of the OMA anchors 106, 108. Fvib_top sideband frequency 540 may be tunable with a sinusoidal modulator to drive the sideband component of first laser 512, and Fvib_bottom sideband frequency 590 may tunable with a sinusoidal modulator to drive the sideband component of second laser 562.

The vibrational mixer (Mv) signals that are used to derive sideband frequency modulator signals 516 ("Fvib_top"), 566 ("Fvib_bottom") may also be used to operate sideband ditherer signal (F2) to generate a second feedback signal FB2 to feed back to tune single sideband modulators 514, 564 to provide the reverse derivatives of the sideband signals, and thus to provide the input to the sideband frequency counters. Accelerometer 500 may difference the readings of the sideband frequency counters to derive the final result for acceleration, as a proportion of the difference between the sideband frequency counters. As a particular example, accelerometer may determine the acceleration as the difference of the counter output of the first sideband frequency modulator signal 516 (Fvib_top) minus the counter output of the second sideband frequency modulator signal 576 ("Fvib_bottom"), times the scale factor, minus a calibration offset, or:

acceleration=(scale factor)*(count_vib_top–count_vib_bottom)–(calibration offset)

Figure 6:
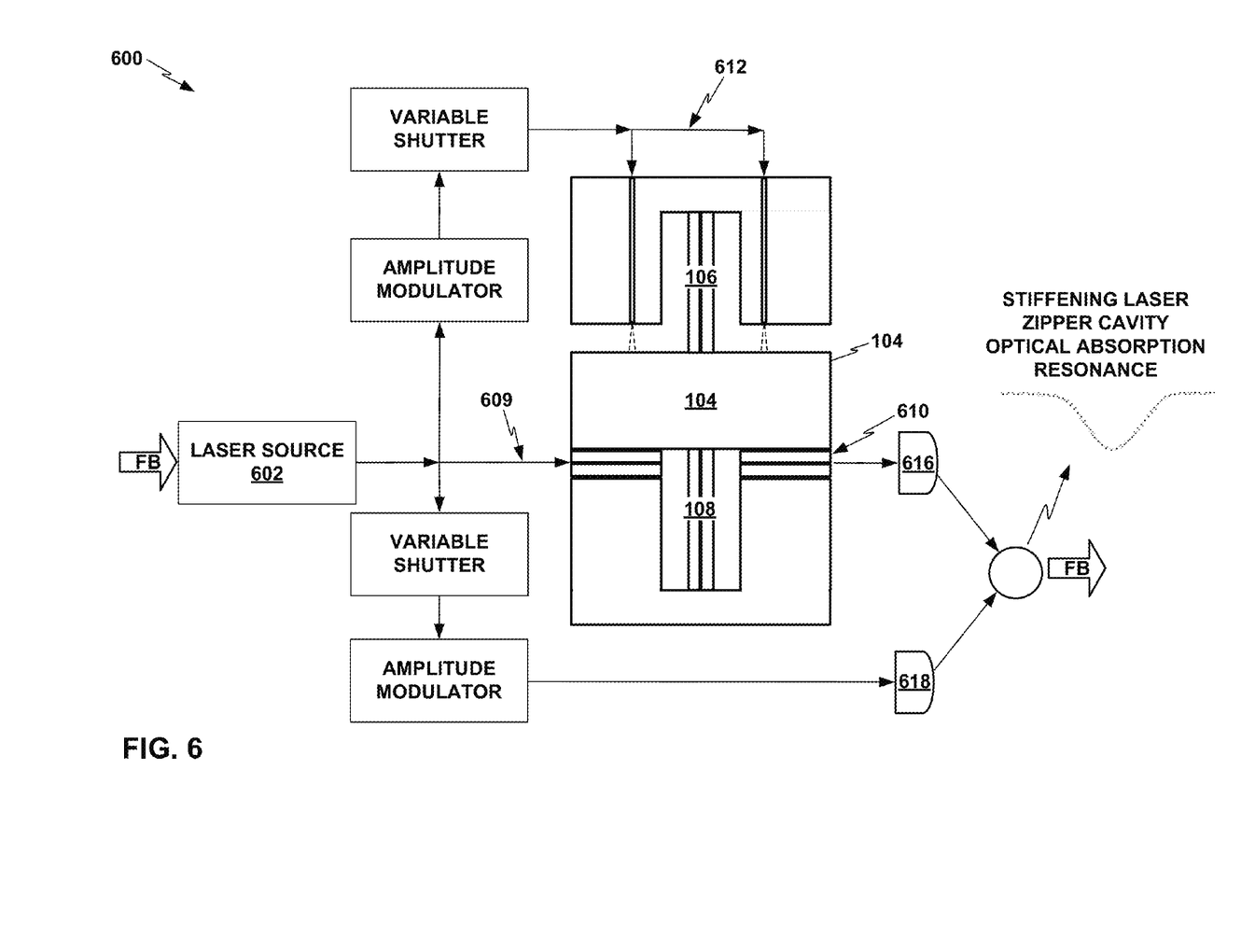
FIG. 6 depicts a conceptual diagram of an opto-mechanical accelerometer that includes a third laser and a third, perpendicular OMA anchor, in another aspect of this disclosure.

FIG. 6 depicts a conceptual diagram of an accelerometer 600, analogous to accelerometer 100 described above but that also includes additional lasers and a third, perpendicular zipper opto-mechanical cavity 610, in another aspect of this disclosure. Accelerometer 600 incorporates capabilities to perform in-situ bias and scale factor calibration. Accelerometer 600 includes OMA anchors 106, 108 as described above, as well as perpendicular stiffening zipper opto-mechanical cavity 610 formed between the frame 102 and the proof mass 104, and one or more pusher lasers 612 in a configuration to push one side of proof mass 104. The "stiffening" laser 609 for the stiffening zipper opto-mechanical cavity 610 may be driven by its own laser source 602, which may also drive pusher laser 612, and which is locked to the side of the optical resonance of 610 by a balanced photodetection method. Pusher lasers 612 may be conducted through conduits in frame 102 to intercept and exert momentum against proof mass 104. The laser light for the stiffening laser 609 for the opto-mechanical zipper cavity 610 and pusher laser 612 may be passed through variable shutters or other means to select to transmit laser light through either or both the stiffening opto-mechanical zipper cavity 610 and/or the pusher laser 612. Accelerometer 600 may compare the stiffening laser 609 after emerging from zipper opto-mechanical cavity 610 with a companion laser from laser source 602, via photodiodes 616 and 618, to determine a stiffening laser zipper cavity optical absorption resonance, and use that resonance as feedback (FB) to drive laser source 602, as shown in FIG. 6.

When laser power on the order of 1 milliwatt (mW) is directed into the stiffening opto-mechanical zipper cavity, the proof mass may experience an effective spring constant due to an optical-spring effect in mechanical parallel with the material stiffness of the OMA anchor and any other anchors which supply restoring forces to the proof mass 104 in the sensitive direction. The additional spring constant supplied by the optical-stiffening cavity may be either additive or subtractive relative to the spring constant due to the mechanical forces supplied by the OMA anchor or other anchors which constrain the proof mass 104 position. The additive or subtractive characteristic of the additional stiffening force derives from the relative detuning of the stiffening laser lock point as compared to the optical resonance of the stiffening opto-mechanical cavity of the resonance of OMA anchor 106, reducing the total spring constant, and of the optical resonance of OMA anchor 108, increasing the spring constant. In this case, the same spring-type restorative forces required to constrain the proof mass 104 (when the frame 102 undergoes acceleration) is now contributed to not only by the two OMA anchors 106, 108, but also by the optical-stiffening force of the energized auxiliary opto-mechanical zipper cavity 610. Thus, the strain experienced by the OMA anchors 106, 108, for a given acceleration of the accelerometer 100, may be less or more, for the same acceleration, than in the configuration where the optical-stiffening opto-mechanical zipper cavity is not energized with the driving laser. In other words, the scale factor relating acceleration to vibrational frequency shift has been modified—either increased or decreased—which enables the implementation of certain types of in-situ bias calibration protocols.

Laser power is applied to the laser pusher 612, which is a structure that directs laser power to push on the proof mass in the sense direction (e.g., in-plane for an in-plane accelerometer). The structure of laser pusher 612 may be composed of integrated waveguides or other optical guiding structures on the frame which cause laser power to be directed at the proof mass, in conjunction with integrated waveguides or other optical guiding structures on the proof mass iron the and/or waveguides on the proof mass which reflect or otherwise reverse the optical power, causing it to impart a recoil, or reaction, force to the proof mass 104. The intensity of the pusher laser 612 incident on the proof mass 104 may be modulated by an integrated amplitude modulator, and thereby the recoil, or reaction, force applied to the proof mass may be modulated. The amplitude and phase of the mechanical response of the proof mass 104 to application of the modulated force may be measured in a lock-in fashion, and thus permit the measurement of the resonance frequency and quality factor of the proof-mass mode, which is a pre-requisite step for the implementation of certain types of in-situ scale factor calibration protocols.

In some examples, accelerometer 600 can implement scale-factor calibration and/or bias calibration protocols periodically, including before and after launch of a platform incorporating accelerometer 600. In other examples, accelerometer 600 can implement scale-factor calibration and/or bias calibration protocols continuously, or quasi-continuously, during operation.

Figure 7:
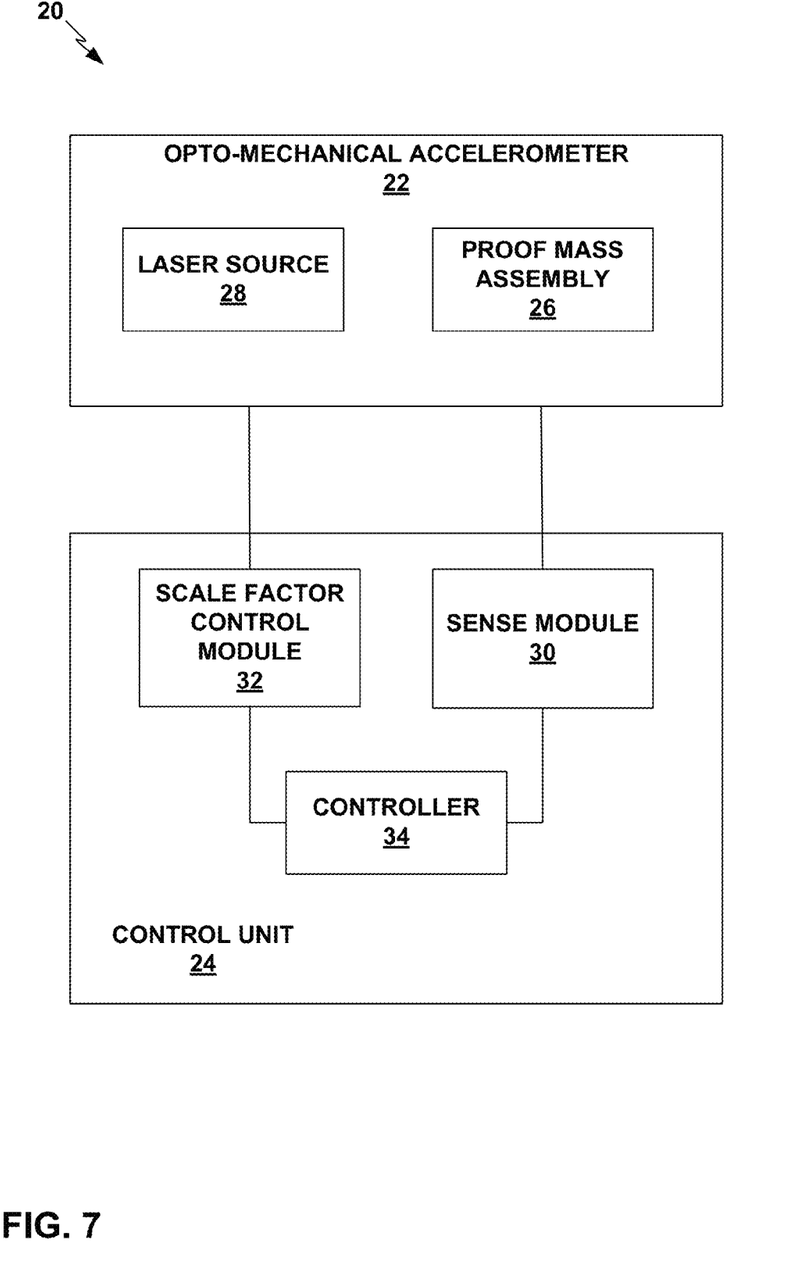
FIG. 7 is a block diagram of an example opto-mechanical accelerometer system formed in accordance with aspects of this disclosure.

FIG. 7 is a block diagram of an example opto-mechanical accelerometer system 20 formed in accordance with aspects of this disclosure. Opto-mechanical accelerometer system 20 may coincide with an implementation of accelerometers 100, 500, or 600 as discussed above. The opto-mechanical accelerometer system 20 includes an opto-mechanical accelerometer 22 and a control unit 24. The opto-mechanical accelerometer 22 includes a proof mass assembly 26 assembly and a laser source 28. The control unit 24 includes a sense module 30 and a scale factor control module 32, both in signal communication with the MEMS accelerometer 22. The control unit 24 also includes a controller 34 in signal communication with the sense module 30 and the scale factor calibration and bias calibration control module 32. In the example of FIG. 7, sense module 30, scale factor calibration and bias calibration control module 32, and controller 34 have been shown separately for purposes of simplifying explanation, but sense module 30, scale factor calibration and bias calibration control module 32, and controller 34 may be highly integrated in some implementations.

Figure 8:
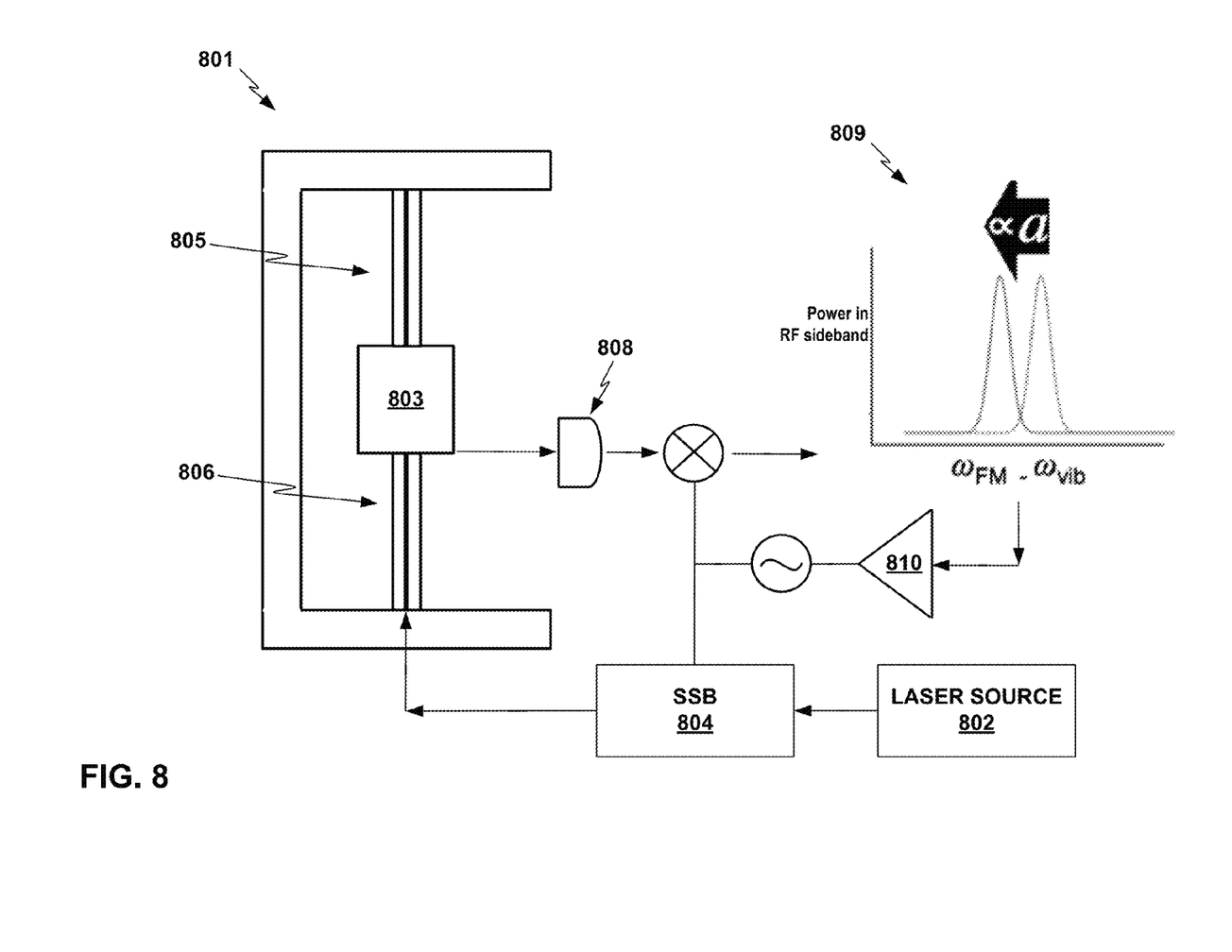
FIG. 8 is a conceptual diagram of an example system for measuring acceleration based on resonances of mechanical modes of OMA anchors of an OMVB accelerometer as tracked with a frequency-locked modulated laser.

FIG. 8 is a conceptual diagram of an example system 800 for measuring acceleration based on resonances of mechanical modes of OMA anchors 805, 806 of an OMVB accelerometer 801 as tracked with a frequency-locked modulated laser. OMA anchors 805, 806 suspend proof mass 803 in OMVB accelerometer 801. Laser source 802 emits a laser to single sideband (SSB) modulator 804 which phase modulates the laser light. The modulated laser is coupled into DETF-topology OMA anchor 806 via an integrated waveguide or tapered optical fiber. In other examples, a laser may also be conducted through OMA anchor 805 or both of OMA anchors 805, 806. When the phase modulation frequency of the laser matches the resonant frequency of an optically-coupled vibration mode of OMA anchor 806, a strong enhancement of the transmitted sideband power is observed at photodiode 808, due to stimulated Raman scattering of photons in the optical carrier of the laser light into the sideband, mediated by phonons in the DETF vibrational or mechanical resonance mode of OMA anchor 806. The optical signal at photodiode 808 is used to generate an error signal or difference signal 809, indicative of the difference between the tunable frequency and the vibrational frequency in terms of the power in the RF sideband, suitable for an RF frequency locked loop (FLL) or phase locked loop (PLL) 810 that actively locks a crystal oscillator to follow the vibrational frequencies of the DETF OMA anchor 806. By differencing the frequencies of the crystal oscillators locked to each DETF, the acceleration information can be extracted with an SNR up to the limits of laser-shot-noise.

Control unit 24 and the various components of control unit 24 may be implemented as any suitable arrangement of hardware, software, firmware, or any combination thereof, to perform the techniques attributed to control unit 24. For example, control unit 24 may include any of one or more microprocessors, digital signal processors (DSPs), application specific integrated circuits (ASICs), field programmable gate arrays (FPGAs), or any other equivalent integrated or discrete logic circuitry, as well as any combinations of such components. Control unit 24 may additionally include memory and other components.

In one or more examples, the accelerometers described herein may utilize hardware, software, firmware, or any combination thereof for achieving the functions described. Those functions implemented in software may be stored on or transmitted over, as one or more instructions or code, a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure.

Instructions may be executed by one or more processors within the accelerometer or communicatively coupled to the accelerometer. The one or more processors may, for example, include one or more DSPs, general purpose microprocessors, application specific integrated circuits ASICs, FPGAs, or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for performing the techniques described herein. Also, the techniques could be fully implemented in one or more circuits or logic elements.

The techniques of this disclosure may be implemented in a wide variety of devices or apparatuses that include integrated circuits (ICs) or sets of ICs (e.g., chip sets). Various components, modules, or units are described in this disclosure to emphasize functional aspects of devices configured to perform the disclosed techniques, but do not necessarily require realization by different hardware units. Rather, various units may be combined or provided by a collection of interoperative hardware units, including one or more processors as described above, in conjunction with suitable software and/or firmware.

Various aspects of the disclosure have been described. These and other aspects are within the scope of the following claims.

What is claimed is:

1. A system configured to:
   couple one or more lasers into optical resonance with one or more opto-mechanically active (OMA) anchors suspending a proof mass in an accelerometer;
   lock frequencies of the one or more lasers to one or more optical resonances of the one or more opto-mechanically active anchors, resulting in a modulated laser coupled with the one or more opto-mechanically active anchors;
   demodulate a photocurrent generated by a photodiode that detects the modulated laser coupled with the one or more opto-mechanically active anchors to detect at least one of an amplitude or a phase of the modulated laser;
   lock a frequency of the modulated laser to dynamically track instantaneous resonance frequencies of one or more mechanical modes of the one or more opto-mechanically active anchors through changes to at least one of the amplitude or the phase of the modulated laser induced by the coupling of the modulated laser to the mechanical modes of the one or more opto-mechanically active anchors; and
   measure an acceleration of the accelerometer based at least in part on the instantaneous resonance frequencies of the one or more mechanical modes of the one or more opto-mechanically active anchors, as dynamically tracked through the changes to the at least one of the amplitude or the phase of the modulated laser.

2. The system of claim 1, wherein the one or more opto-mechanically active anchors comprise one or more double-ended tuning fork structures.

3. The system of claim 2, wherein the one or more double-ended tuning fork structures each comprise:
   two or more photonic crystal mechanical beams with a gap between the two or more photonic crystal mechanical beams.

4. The system of claim 1, wherein the system is further configured to calibrate a scale factor of the accelerometer.

5. The system of claim 4, wherein the system is further configured to:
   apply a reaction force to the proof mass using a pushing laser, wherein being configured to calibrate the scale factor comprises being configured to detect a response of the accelerometer to the pushing laser.

6. The system of claim 1, wherein the system is further configured to calibrate a bias of the accelerometer.

7. The system of claim 6, wherein the system is further configured to:
   couple a stiffening laser into the one or more opto-mechanically active anchors coupled to the proof mass, wherein calibrating the bias comprises detecting a response of the accelerometer to the stiffening laser.

8. A method comprising:
   coupling one or more lasers into optical resonance with one or more opto-mechanically active (OMA) anchors suspending a proof mass in an accelerometer;
   locking frequencies of the one or more lasers to one or more optical resonances of the one or more opto-mechanically active anchors, resulting in a modulated laser coupled with the one or more opto-mechanically active anchors;
   demodulating a photocurrent generated by a photodiode that detects the modulated laser coupled with the one or more opto-mechanically active anchors to detect at least one of an amplitude or a phase of the modulated laser;
   locking a frequency of the modulated laser to dynamically track instantaneous resonance frequencies of one or more mechanical modes of the one or more opto-mechanically active anchors through changes to at least one of the amplitude or the phase of the modulated laser induced by the coupling of the modulated laser to the mechanical modes of the one or more opto-mechanically active anchors; and
   measuring an acceleration of the accelerometer based at least in part on the instantaneous resonance frequencies of the one or more mechanical modes of the one or more opto-mechanically active anchors, as dynamically tracked through the changes to the at least one of the amplitude or the phase of the modulated laser.

9. The method of claim 8, wherein coupling the one or more lasers into optical resonance with the one or more opto-mechanically active (OMA) anchors comprises coupling the one or more lasers into optical resonance with one or more double-ended tuning fork structures that each comprise two or more photonic crystal mechanical beams with a gap between the two or more photonic crystal mechanical beams.

10. The method of claim 8, further comprising calibrating a scale factor of the accelerometer.

11. The method of claim 10, further comprising:
   passing a stiffening laser through a calibration opto-mechanical coupling structure; and
   imposing a pushing laser on the proof mass,
   wherein calibrating the scale factor comprises detecting a response of the accelerometer to the stiffening laser and the pushing laser.

12. The method of claim 8, further comprising calibrating a bias of the accelerometer.

13. The method of claim 12, further comprising coupling a stiffening laser into the one or more opto-mechanically active anchors coupled to the proof mass, wherein calibrating the bias comprises detecting a response of the accelerometer to the stiffening laser.

14. A device comprising:
    means for coupling one or more lasers into optical resonance with one or more opto-mechanically active (OMA) anchors suspending a proof mass in an accelerometer;
    means for locking frequencies of the one or more lasers to one or more optical resonances of the one or more opto-mechanically active anchors, resulting in a modulated laser coupled with the one or more opto-mechanically active anchors;
    means for demodulating a photocurrent generated by a photodiode that detects the modulated laser coupled with the one or more opto-mechanically active anchors to detect at least one of an amplitude or a phase of the modulated laser;
    means for locking a frequency of the modulated laser to dynamically track instantaneous resonance frequencies of one or more mechanical modes of the one or more opto-mechanically active anchors through changes to at least one of the amplitude or the phase of the modulated laser induced by the coupling of the modulated laser to the mechanical modes of the one or more opto-mechanically active anchors; and
    means for measuring an acceleration of the accelerometer based at least in part on the instantaneous resonance frequencies of the one or more mechanical modes of the one or more opto-mechanically active anchors, as dynamically tracked through the changes to the at least one of the amplitude or the phase of the modulated laser.

15. The device of claim 14, wherein the one or more opto-mechanically active anchors comprise one or more double-ended tuning fork structures.

16. The device of claim 15, wherein the one or more double-ended tuning fork structures each comprise:
    two or more photonic crystal mechanical beams with a gap between the two or more photonic crystal mechanical beams.

17. The device of claim 14, wherein the system is further configured to calibrate a scale factor of the accelerometer.

18. The device of claim 17, wherein the system further comprises:
    means for apply a reaction force to the proof mass using a pushing laser, wherein being calibrating the scale factor comprises detecting a response of the accelerometer to the pushing laser.

19. The device of claim 14, further comprising means for calibrating a bias of the accelerometer.

20. The device of claim 19, further comprising:
    means for coupling a stiffening laser into the one or more opto-mechanically active anchors coupled to the proof mass, wherein calibrating the bias comprises detecting a response of the accelerometer to the stiffening laser.

* * * * *